United States Patent
Lee et al.

(10) Patent No.: US 9,673,218 B1
(45) Date of Patent: Jun. 6, 2017

(54) METHOD OF MANUFACTURING SEMICONDUCTOR DEVICE INCLUDING CHANNEL LAYER

(71) Applicant: SK hynix Inc., Icheon-si, Gyeonggi-do (KR)

(72) Inventors: Hyun Ho Lee, Icheon-si (KR); Ji Hye Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/422,141

(22) Filed: Feb. 1, 2017

Related U.S. Application Data (62) Division of application No. 14/493,446, filed on Sep. 23, 2014, now Pat. No. 9,601,504.

(30) Foreign Application Priority Data

Jun. 27, 2014 (KR) .................. 10-2014-0079896

(51) Int. Cl.
| | | |
|---|---|---|
| H01L 21/336 | (2006.01) | |
| H01L 27/11582 | (2017.01) | |
| H01L 27/11524 | (2017.01) | |
| H01L 27/11556 | (2017.01) | |
| H01L 27/1157 | (2017.01) | |

(52) U.S. Cl.
CPC .... H01L 27/11582 (2013.01); H01L 27/1157 (2013.01); H01L 27/11524 (2013.01); H01L 27/11556 (2013.01)

(58) Field of Classification Search
CPC .......... H01L 27/11578; H01L 27/1158; H01L 27/11582; H01L 27/11551; H01L 27/11553; H01L 27/11556; H01L 27/1157; H01L 27/11524
See application file for complete search history.

(56) References Cited

U.S. PATENT DOCUMENTS

| | | |
|---|---|---|
| 7,927,967 B2 | 4/2011 | Nomura et al. |
| 2010/0232224 A1 | 9/2010 | Maeda et al. |
| 2012/0168824 A1 | 7/2012 | Lee |
| 2013/0083601 A1 | 4/2013 | Liu et al. |

FOREIGN PATENT DOCUMENTS

KR    1020130070922 A    6/2013

*Primary Examiner* — Jesse Y Miyoshi
(74) *Attorney, Agent, or Firm* — William Park & Associates Ltd.

(57) ABSTRACT

A semiconductor device according to an embodiment of the invention includes a pipe channel layer including a first portion and a second portion protruding from the first portion, first channel pillars protruding from the second portion of the pipe channel layer, and second channel pillars protruding from the first portion of the pipe channel layer.

4 Claims, 11 Drawing Sheets

METHOD OF MANUFACTURING SEMICONDUCTOR DEVICE INCLUDING CHANNEL LAYER

CROSS-REFERENCE TO RELATED APPLICATION

The present application is a divisional application of U.S. application Ser. No. 14/493,446, filed on Sep. 23, 2014, and claims priority to Korean patent application number 10-2014-0079896 filed on Jun. 27, 2014, in the Korean Intellectual Property Office, the entire disclosure of which is incorporated by reference herein.

BACKGROUND

1. Technical Field

Various embodiments relate generally to a semiconductor device and a method of manufacturing the same and, more particularly, a three-dimensional semiconductor device and a method of manufacturing the same.

2. Related Art

Semiconductor devices are developed in various structures to increase integrity. As an example, there is a three-dimensional semiconductor device including three-dimensionally arranged memory cells.

The memory cells of the three-dimensional semiconductor device are connected in series along a channel layer to configure a cell string. The memory cells of the three-dimensional semiconductor device are connected to word lines. The word lines surround a channel layer and are spaced apart in an extending direction of the channel layer.

Various technology is being developed in order to improve integrity and process stability of the three-dimensional semiconductor device.

SUMMARY

According to an aspect of the invention, there is provided a semiconductor device including a pipe channel layer including a first portion and a second portion protruding from the first portion. The semiconductor device may also include first channel pillars protruding from the second portion of the pipe channel layer. In addition, the semiconductor device may also include second channel pillars protruding from the first portion of the pipe channel layer.

According to an aspect of the invention, there is provided a semiconductor device including a pipe channel layer including a first portion and a second portion configured to protrude from a center area of the first portion. The semiconductor device also includes first channel pillars configured to protrude from the second portion. Further, the semiconductor device also includes second channel pillars configured to protrude from the first portion with the first channel pillars therebetween. The semiconductor device also includes first conductive patterns that surround the first channel pillars and second conductive patterns that surround the second channel pillars. The semiconductor device also includes a first slit disposed between the first channel pillars that separates the first conductive patterns, and a second slit disposed between the first channel pillars and the second channel pillars that separates the first conductive patterns and the second conductive patterns.

According to an aspect of the invention, there is provided a method of manufacturing a semiconductor device including forming a lower structure including a pipe channel region filled with a first sacrificial layer pattern and a second sacrificial layer pattern, wherein the second sacrificial pattern is in contact with and disposed on the first sacrificial pattern. The method may also involve alternately stacking first material layers and second material layers on the lower structure. Further, the method may also involve forming first channel holes and second channel holes passing through the first and second material layers, wherein the first channel holes open the second sacrificial layer pattern and the second channel holes open the first sacrificial layer pattern. In addition, the method may also involve opening the pipe channel region by removing the first and second sacrificial layer patterns through the first and second channel holes. Moreover, the method may also include forming a channel layer in the first and second channel holes and the pipe channel region.

DETAILED DESCRIPTION

Various embodiments of the invention will be described in detail below with reference to the accompanying drawings. The embodiments of the invention may, however, be modified in different forms and should not be construed as limited to the embodiments set forth. Rather, these embodiments are provided so that this disclosure is thorough and complete and fully conveys the inventive concept to those skilled in the art, and the inventive concept is only defined by the scope of the appended claims. The present invention is directed to a semiconductor device capable of improving integrity and process stability, and a method of manufacturing the same.

Figure 1:
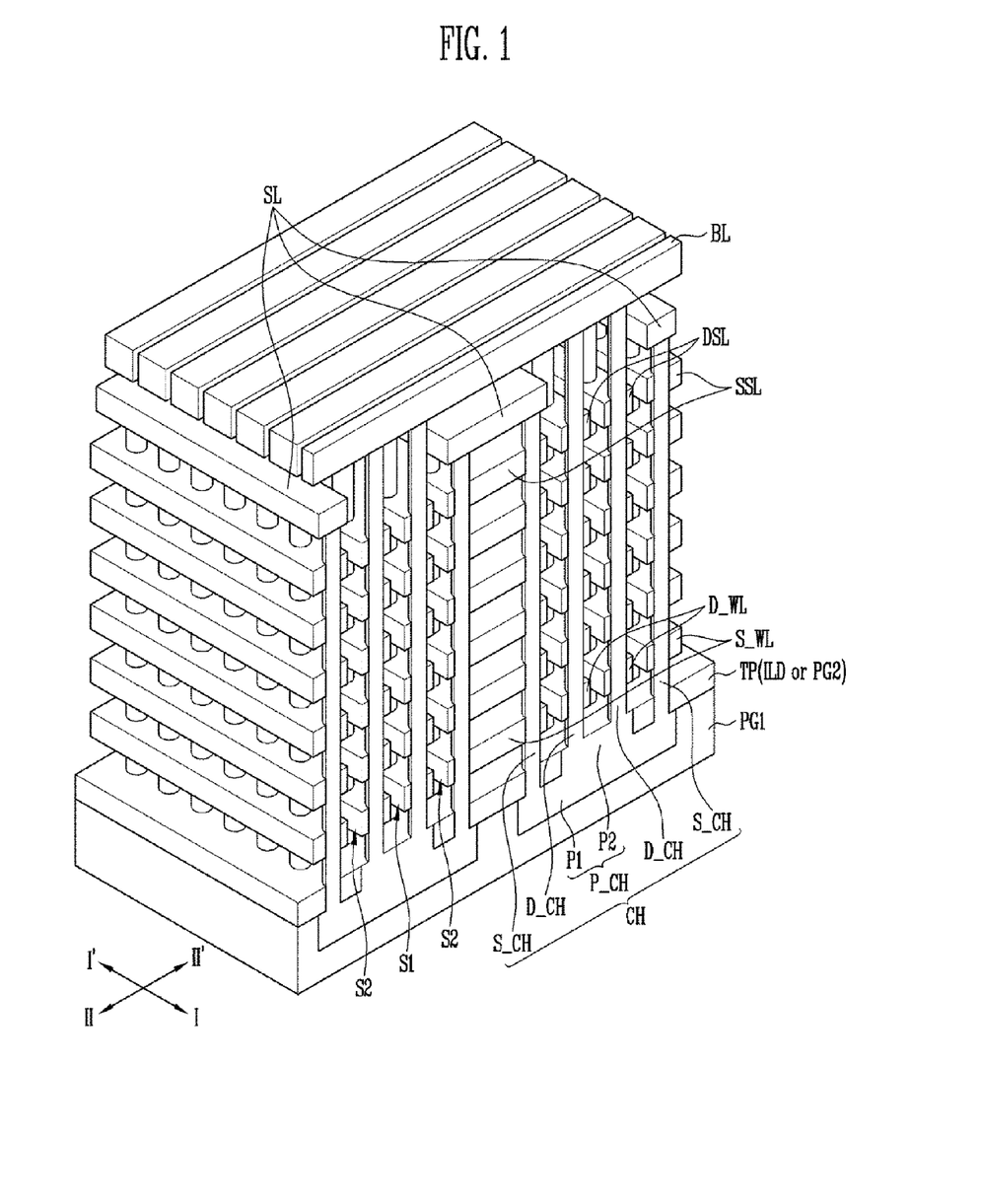
FIG. 1 is a perspective view showing a semiconductor device according to an embodiment of the invention.

Referring to FIG. 1, a perspective view showing a semiconductor device according to an embodiment of the invention is shown. FIG. 1 shows a cell array region of a semiconductor device.

The semiconductor device according to an embodiment includes memory cells arranged along a channel layer CH. The channel layer CH is formed in a channel region.

The channel layer CH includes a pipe channel layer P_CH and channel pillars D_CH and S_CH protruding from the pipe channel layer P_CH. The pipe channel layer P_CH may be arranged in the form of a matrix. The pipe channel layer P_CH includes a first portion P1 and a second portion P2 protruding from the first portion P1. The memory cells are stacked along each of the channel pillars D_CH and S_CH protruding from the pipe channel layer P_CH to configure a three-dimensional cell string.

A side surface and a bottom surface of the first portion P1 of the pipe channel layer P_CH may be surrounded by a first pipe gate PG1. A side surface and a top surface of the second portion P2 of the pipe channel layer P_CH may be surrounded by a top pattern TP.

The top pattern TP may be arranged on the first pipe gate PG1 to be in contact with the first pipe gate PG1. The top pattern TP may be a first insulating layer ILD or a second pipe gate PG2. A pipe transistor is formed at an intersection of the first pipe gate PG1 and the pipe channel layer P_CH. When the top pattern TP is the second pipe gate PG2, the pipe transistor is formed along the intersection of the first pipe gate PG1 and the pipe channel layer P_CH, and an intersection of the second pipe gate PG2 and the pipe channel layer P_CH.

The second portion P2 of the pipe channel layer P_CH may open both sides of the first portion P1. The second portion P2 may also be disposed on a center area of the first portion P1. The channel pillars D_CH and S_CH may protrude from the second portion P2 disposed on the center area of the pipe channel layer P_CH, and from both ending parts of the first portion P1 opened at both sides of the second portion P2. The first channel pillars D_CH protruding from the second portion P2 may be electrically coupled to a bit line BL disposed above the memory cells. The second channel pillars S_CH protruding from the first portion P1 may be electrically coupled to common source lines SL disposed above the memory cells.

At least one pair of the first channel pillars D_CH may be electrically coupled to the second portion P2. Each of the first channel pillars D_CH is surrounded by first conductive patterns D_WL and DSL.

The first conductive patterns D_WL and DSL may include at least one layer of drain select lines DSL, and drain-side word lines D_WL disposed under the drain select lines DSL. Drain select transistors are formed at intersections of the first channel pillars D_CH and the drain select lines DSL. Memory cells are formed at intersections of the first channel pillars D_CH and the drain-side word lines D_WL.

The second channel pillars S_CH may be disposed with the first channel pillars D_CH therebetween. Each of the second channel pillars S_CH may be surrounded by second conductive patterns S_WL and SSL. The second conductive patterns S_WL and SSL may include at least one layer of source select lines SSL, and source-side word lines S_WL disposed under the source select lines SSL. Source select transistors are formed at intersections of the second channel pillars S_CH and the source select lines SSL. Memory cells are formed at intersections of the second channel pillars S_CH and the source-side word lines S_WL.

The first conductive patterns D_WL and DSL and the second conductive patterns S_WL and SSL may extend in a first direction. The common source lines SL may extend in the first direction. The bit line BL may extend in a second direction that intersects the first direction.

A first slit S1 is disposed between the first channel pillars D_CH. The first slit S1 may separate the first conductive patterns D_WL and DSL. A second slit S2 is disposed between a first channel pillar D_CH and a second channel pillar S_CH that are adjacent among each other. The second slit S2 separates the first conductive patterns D_WL and DSL and the second conductive patterns S_WL and SSL. Bottom surfaces of the first and second slits S1 and S2 are disposed to be higher than the first portion P1 of the pipe channel layer P_CH. The first slit S1 may be disposed on the second portion P2 of the pipe channel layer P_CH. The second slit S2 may be disposed on the first portion P1 of the pipe channel layer P_CH. The top pattern TP may be disposed between the second slit S2 and the pipe channel layer P_CH.

An etch process of opening the first slit S1 and the second slit S2 may be performed to separate the first conductive patterns D_WL and DSL and the second conductive patterns S_WL and SSL. At this time, the pipe channel layer P_CH may be etched. The pipe channel layer P_CH according to an embodiment may include the second portion P2 protruding from the first portion P1. Accordingly, the first portion P1 is disposed further away from the bottom surfaces of the first slit S1 and the second slit S2 than the second portion P2. Accordingly, even when the pipe channel layer P_CH is etched due to the etch process of opening the first slit S1 and the second slit S2, only the second portion P2 relatively closer to the first slit S1 and the second slit S2 may be etched. In addition, the first slit S1 and the second slit S2 may be disposed at a higher level than the first portion P1 without fully penetrating to the first portion P1 of the pipe channel layer P_CH. Accordingly, an embodiment of the invention may reduce failures in which the pipe channel layer P_CH is broken. In addition, when the second slit S2 is disposed with the top pattern TP therebetween on the first portion P1 of the pipe channel layer P_CH, the top pattern TP may protect the first portion P1 from being etched during the etch process of opening the second slit S2.

Multiple layers may be formed between each of the conductive patterns D_WL, DSL, S_WL, and SSL and the channel layer CH. The multiple layers may include at least one of a tunnel insulating layer, a data storage layer, and a blocking insulating layer. The tunnel insulating layer may be formed of a silicon oxide layer. The data storage layer may be formed of a material layer capable of storing charges in various forms. For example, the data storage layer may be formed of a polysilicon layer which floats charges, or a silicon nitride layer which traps charges. The blocking insulating layer may include at least one of a silicon oxide layer and a high dielectric layer having a higher dielectric constant than the silicon oxide layer.

Figure 2:
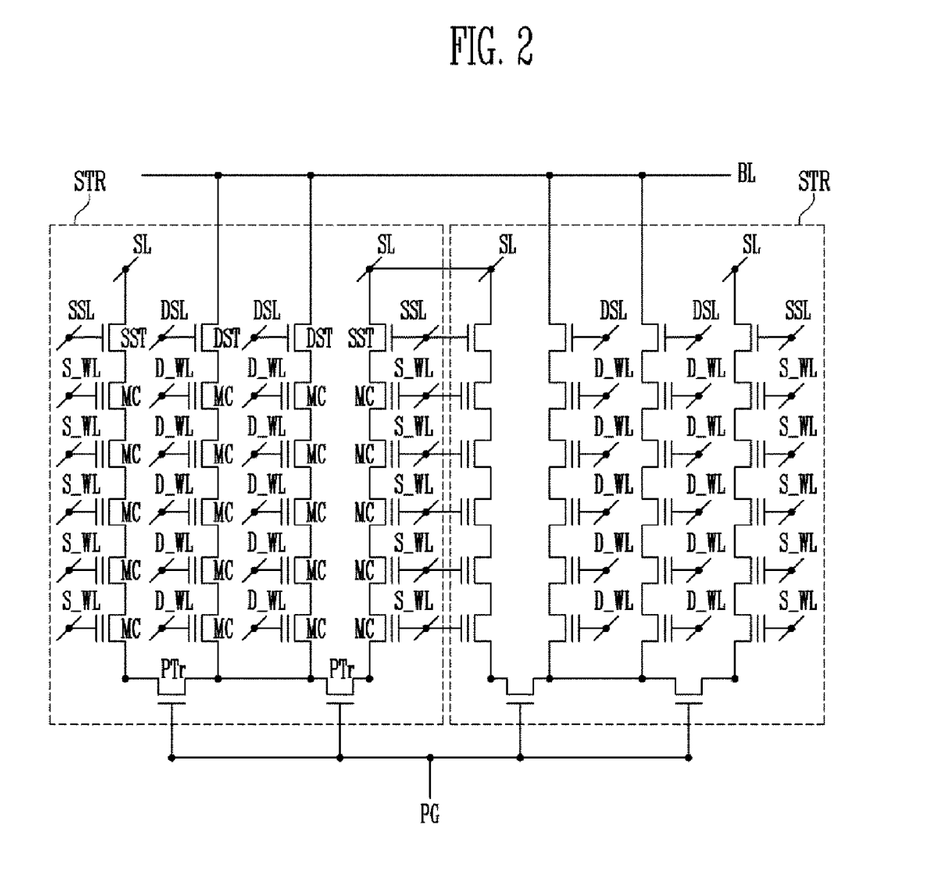
FIG. 2 is a circuit diagram of a semiconductor device according to an embodiment of the invention.

Referring to FIG. 2, a circuit diagram of a semiconductor device according to an embodiment of the invention is illustrated.

The semiconductor device according to an embodiment includes cell strings STR electrically coupled to a pipe gate PG. Each of the cell strings STR includes at least two lines of drain select transistors DST, at least two lines of source select transistors SST, at least four lines of memory cells MC, and at least two lines of pipe transistors PTR.

The drain select transistors DST included in one cell string STR may be electrically coupled to one corresponding bit line BL. The drain select transistors DST may be disposed between the source select transistors SST. Gates of the drain select transistors DST may be electrically coupled to drain select lines DSL.

The source select transistors SST may be electrically coupled to common source lines SL. The source select transistors SST included in one cell string STR may be disposed with the drain select transistors DST configuring the same cell string STR therebetween. Neighboring cell strings STR may be symmetrically disposed such that the source select transistors SST are adjacent to each other. Gates of the source select transistors SST may be electrically coupled to source select lines SSL. The gates of the source select transistors SST adjacent to each other in a memory block may be commonly electrically coupled to one source select line SSL.

The memory cells MC may be electrically coupled to word lines D_WL and S_WL. The memory cells MC disposed in edge portions of the cell strings STR in a memory block and disposed adjacent to each other on the same layer may be commonly electrically coupled to a word line S_WL disposed on the same layer as the memory cells MC.

Each of the pipe transistors PTR may electrically couple the memory cells disposed under the source select transistor SST to the memory cells disposed under the drain select transistor DST. Gates of the pipe transistors PTR may be commonly electrically coupled to the pipe gate PG separated into memory block units.

Figure 3:
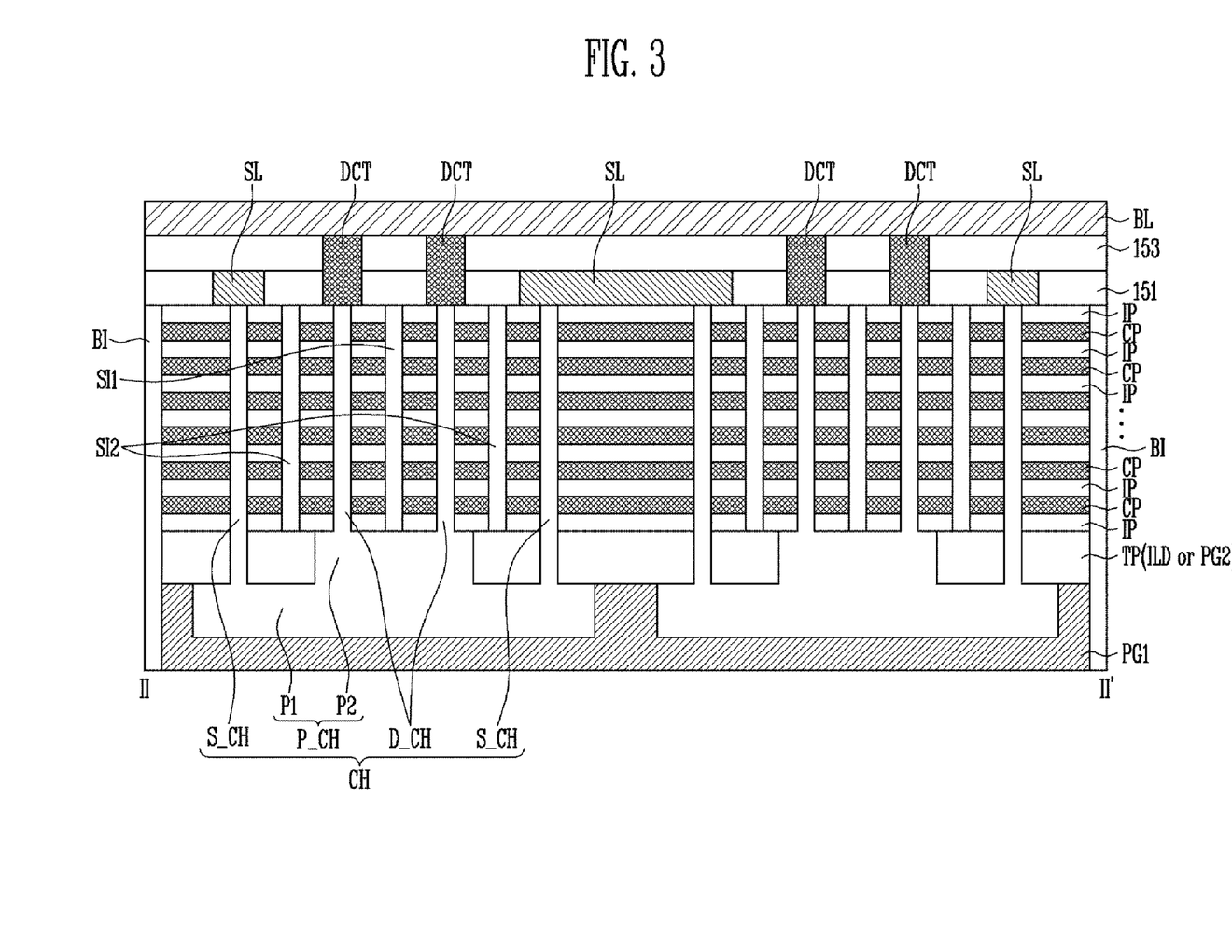
FIG. 3 is a cross-sectional view of a semiconductor device according to an embodiment of the invention.

Referring to FIG. 3, a cross-sectional view of a semiconductor device according to an embodiment of the invention is shown. FIG. 3 is a cross-sectional view showing the structure of the semiconductor device described in FIG. 1 in more detail. Hereinafter, a detailed description of the elements described in FIG. 1 will be omitted for the sake of brevity.

In FIG. 3, a channel layer CH, a first pipe gate PG1, and a top pattern TP are the same as those described in FIG. 1. Second insulating layers IP and conductive patterns CP are alternately stacked on the top pattern TP. A third insulating layer 151 and a fourth insulating layer 153 may be formed on the stacked structure including the second insulating layers IP and the conductive patterns CP. A bit line BL may be formed on the fourth insulating layer 153.

The channel pillars S_CH and D_CH may be formed through the second insulating layers IP and the conductive patterns CP. The conductive patterns CP may be separated by a first slit insulating layer SU filling a first slit (corresponding to S1 of FIG. 1) and a second slit insulating layer SI2 filling a second slit (corresponding to S2 of FIG. 1). Accordingly, the conductive patterns CP may be separated into first conductive patterns D_WL and DSL and second conductive patterns S_WL and SSL as described in FIG. 1.

The first pipe gate PG1, the top pattern TP, the second insulating layers IP, and the conductive patterns CP may be separated into memory block units by a block insulating layer BI formed in a block slit.

The first channel pillars D_CH may be electrically coupled to a bit line BL via drain contact plugs DCT. The drain contact plugs DCT may pass through the third and fourth insulating layers 151 and 153 to be electrically coupled to the first channel pillars D_CH.

The second channel pillars S_CH may be electrically coupled to common source lines SL formed in the third insulating layer 151. The common source lines SL may be insulated from the bit line BL with the fourth insulating layer 153 therebetween.

Figure 4:
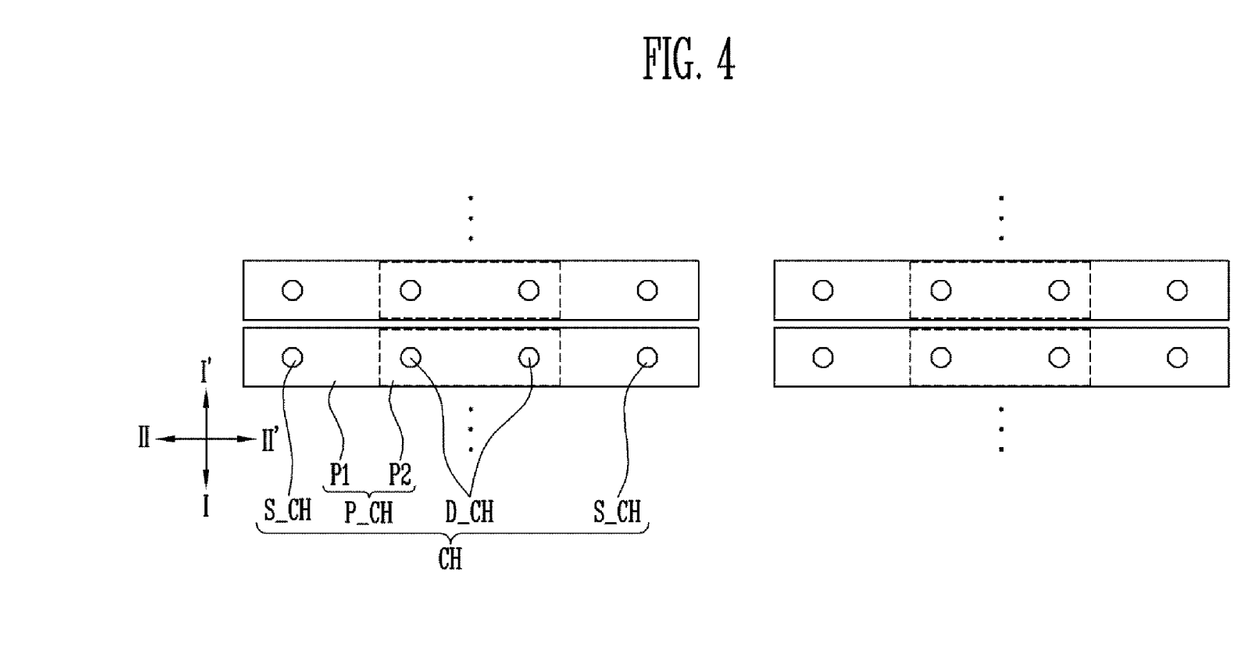
FIG. 4 is a layout of a channel layer according to an embodiment of the invention.

Referring to FIG. 4, a layout of a channel layer according to an embodiment of the invention is shown.

The channel layer CH according to an embodiment may include first and second channel pillars D_CH and S_CH electrically coupled to a pipe channel layer P_CH. At least two first channel pillars D_CH may be electrically coupled to the pipe channel layer P_CH, and at least two second channel pillars S_CH may be electrically coupled to the pipe channel layer P_CH. Thus, the pipe channel layer P_CH electrically coupled to at least four channel pillars D_CH and S_CH may be arranged in the form of a matrix. According to an embodiment of the invention, it is easy to secure a space between bit lines (corresponding to BL of FIG. 1) and reduce a pitch size between the bit lines. As a result, a size of a semiconductor chip may be reduced when the semiconductor chip includes a cell array structure according to an embodiment of the invention.

Figure 5A:
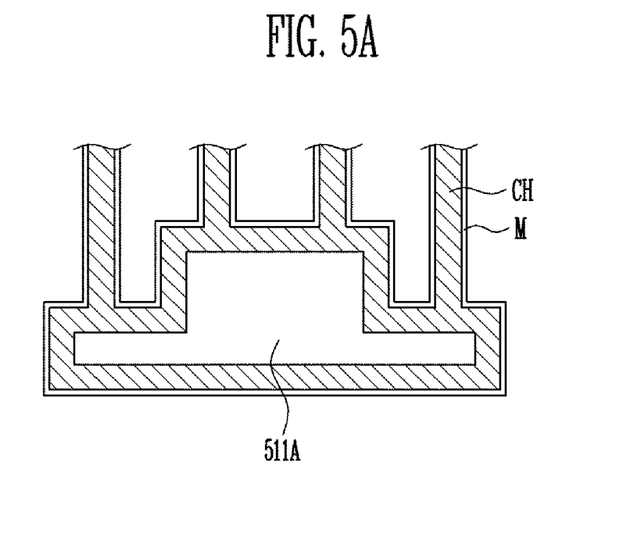
FIGS. 5A and 5B are cross-sectional views for describing structures of channel layers according to embodiments of the invention.
Figure 5B:
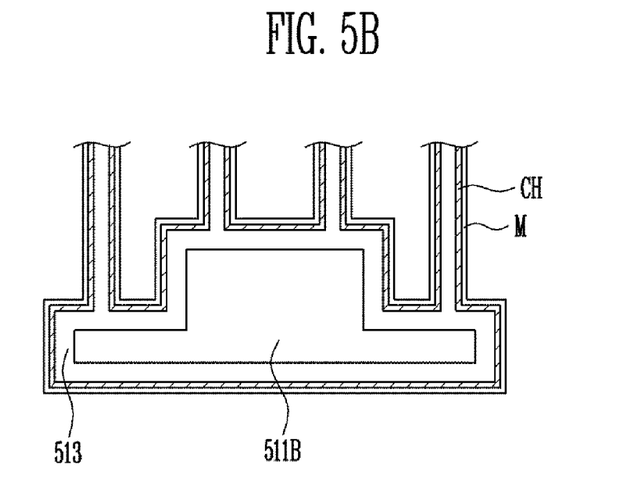

FIGS. 5A and 5B are cross-sectional views for describing structures of channel layers according to embodiments of the invention.

Referring to FIG. 5A, the channel layer CH may be formed to fill a channel region. The channel region includes a channel pillar area and a pipe channel area. The channel pillar area is formed narrower than the pipe channel area. The channel layer CH may be formed to fully fill the channel pillar area which is a relatively narrower portion of the channel region. An air-gap 511A may be formed in the portion (that is, a pipe channel layer) of the channel layer CH disposed in the pipe channel area which is a relatively wider portion of the channel region.

Referring to FIG. 5B, a channel layer CH may be formed along a surface of the channel region. A center area of the channel region opened by the channel layer CH may be filled with an insulating material 513. The insulating material 513 may be formed to fully fill the relatively narrower channel pillar area. An air-gap 511B may be formed in a portion of the insulating material 513 disposed in the relatively wider pipe channel area.

An outer wall of the channel layer CH described in FIGS. 5A and 5B may be surrounded by the multiple layers M described in FIG. 1.

FIGS. 6A to 6G are cross-sectional views for describing a method of manufacturing a semiconductor device according to an embodiment of the invention.

Figure 6A:
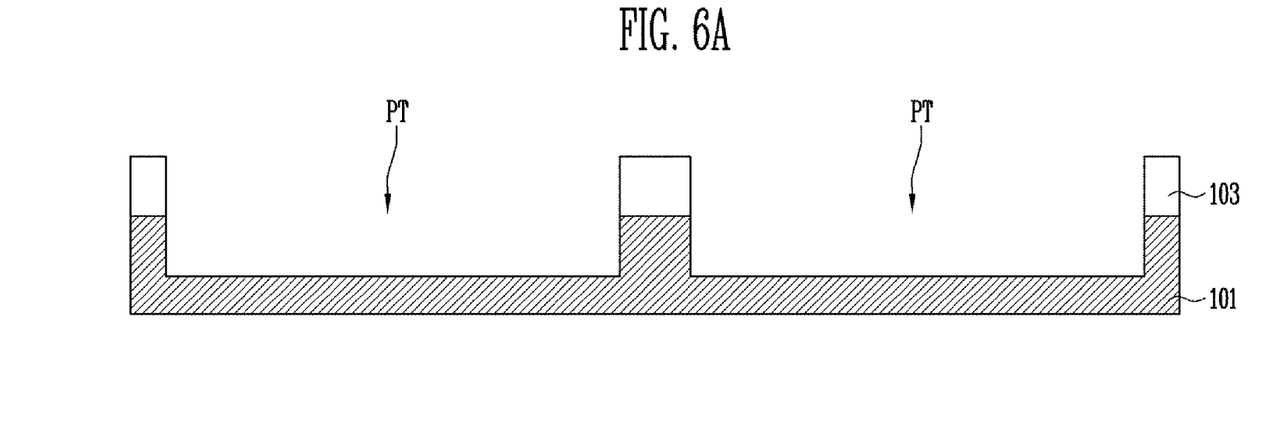
FIGS. 6A to 6G are cross-sectional views for describing a method of manufacturing a semiconductor device according to an embodiment of the invention.

Referring to FIG. 6A, a first conductive layer 101 is formed, and then a first mask pattern 103 is formed on the first conductive layer 101. The first conductive layer 101 may be formed on a semiconductor substrate. The first mask pattern 103 may open a pipe channel area at which a pipe channel layer is to be formed. A pipe trench PT may be formed in the first conductive layer 101 by etching the first conductive layer 101 using the first mask pattern 103 as an etch barrier layer. The first mask pattern 103 may be removed after the pipe trench PT is formed.

Figure 6B:
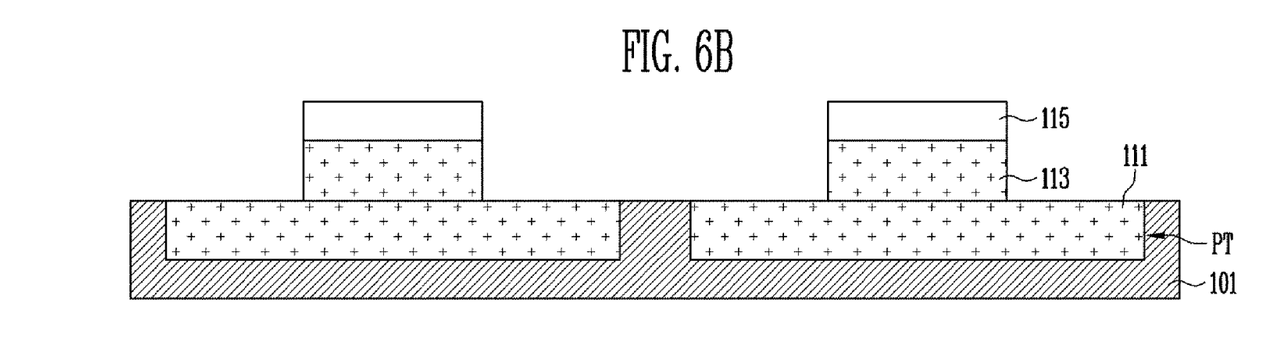

Referring FIG. 6B, a first sacrificial layer pattern 111 may fill the pipe trench PT. A process of forming the first sacrificial layer pattern 111 may include forming a first sacrificial layer to fill the pipe trench PT, and planarizing the first sacrificial layer until a top surface of the first conductive layer 101 is exposed. The planarization process may be performed using a chemical mechanical polishing (CMP) process.

Next, a second sacrificial layer pattern 113 is formed on a portion of the first sacrificial layer pattern 111 so that a portion of the first sacrificial layer pattern 111 is opened. More specifically, the second sacrificial layer pattern 113 may be formed on a center area of the first sacrificial layer pattern 111 and open both sides of the first sacrificial layer pattern 111. The second sacrificial layer pattern 113 is formed to be in contact with the first sacrificial layer pattern 111. The forming of the second sacrificial layer pattern 113 may include stacking a second sacrificial layer and a second mask pattern 115 on the first conductive layer 101 including the first sacrificial layer pattern 111, and etching the second sacrificial layer in an etch process using the second mask pattern 115 as an etch barrier layer. The second mask pattern 115 may be removed after the second sacrificial layer pattern 113 is formed.

Figure 6C:
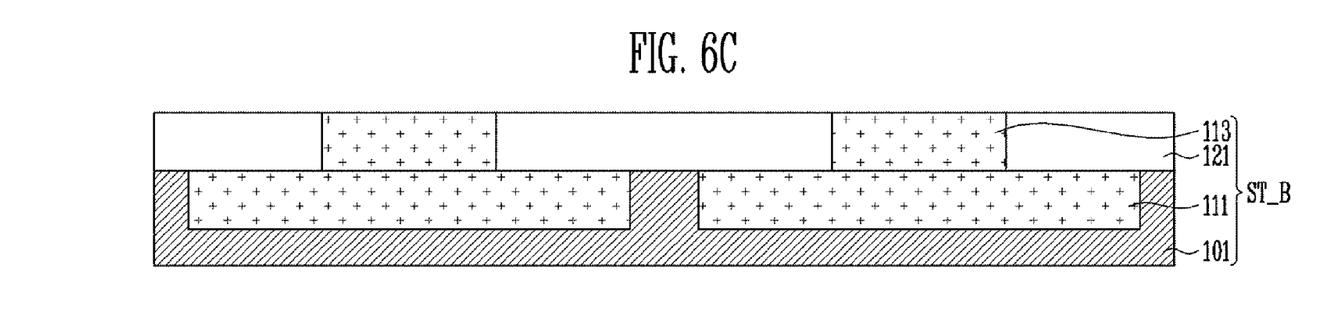

The first sacrificial layer pattern 111 and the second sacrificial layer pattern 113 may be formed of a material having an etch selectivity with respect to the first conductive layer 101, and an upper layer (reference numeral 121 of FIG.

Figure 6D:
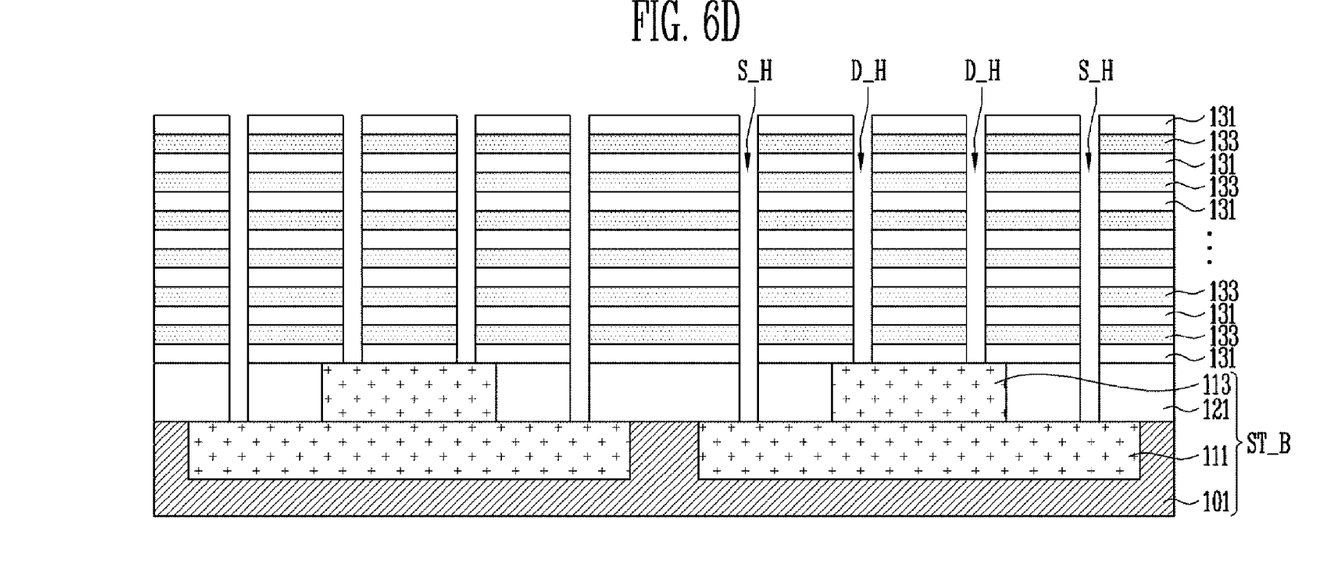

6C) and first and second material layers (reference numeral 131 and 133 of FIG. 6D). The first sacrificial layer pattern 111 and second sacrificial layer pattern 113 may be formed of the same material. For example, the first sacrificial layer pattern 111 and the second sacrificial layer pattern 113 may be formed of TiN.

Referring to FIG. 6C, the upper layer 121 may be formed on the first conductive layer 101 including the first sacrificial layer pattern 111. The upper layer 121 may be formed on an intermediate result in which the second sacrificial layer pattern 113 is formed. The upper layer 121 surrounds the second sacrificial layer pattern 113 and covers the first sacrificial layer pattern 111. The upper layer 121 may be formed of a material having an etch selectivity with respect to the first and second sacrificial layer patterns 111 and 113. The material may be a second conductive layer or a first insulating layer. The second conductive layer may be formed of the same material as the first insulating layer. The first insulating layer may include an oxide layer.

Using the processes described in FIGS. 6A to 6C, a lower structure ST_B including the pipe channel area filled with the first sacrificial layer pattern 111 and the second sacrificial layer pattern 113 may be formed. The lower structure ST_B may be formed using various processes other than the above-described process.

Referring to FIG. 6D, first material layers 131 and second material layers 133 are alternately stacked on the lower structure ST_B. The second material layers 133 are formed of a different material from the first material layers 131. More specifically, the second material layers 133 may be formed of a material having an etch selectivity with respect to the first material layers 131. For instance, the first material layers 131 may be formed of an insulating material insulating conductive patterns. Further, the second material layers 133 may be formed of a conductive material for forming the conductive patterns. Otherwise, the first material layers 131 may be formed of an insulating material insulating the conductive patterns. In addition, the second material layers 133 may be formed of an insulating material for forming a sacrificial layer. As the insulating material insulating the conductive patterns, an oxide layer may be used. As the insulating material for forming the sacrificial layer, a nitride layer having an etch selectivity with respect to the oxide layer may be used. As the conductive material for forming the conductive patterns, at least one of a polysilicon layer, a metal silicide layer, and a metal layer may be used. Otherwise, the first material layers 131 may be formed of a conductive material for forming a sacrificial layer. Further, the second material layers 133 are formed of a conductive material for forming conductive patterns. An undoped polysilicon layer may be used as the conductive material for forming the sacrificial layer. In addition, a doped polysilicon layer may be used as the conductive material for forming the conductive patterns.

Next, channel holes D_H and S_H are formed by etching the first material layers 131 and the second material layers 133. The channel holes D_H and S_H include first channel holes D_H opening the second sacrificial layer pattern 113 through the first material layers 131 and the second material layers 133, and second channel holes S_H opening the first sacrificial layer pattern 111 through the first material layers 131 and the second material layers 133. The second sacrificial layer pattern 113 may be opened by a pair of the first channel holes D_H. The first sacrificial layer pattern 111 may be opened by a pair of the second channel holes S_H facing each other with the first channel holes D_H therebetween. The second channel holes S_H further pass through the upper layer 121.

Figure 6E:
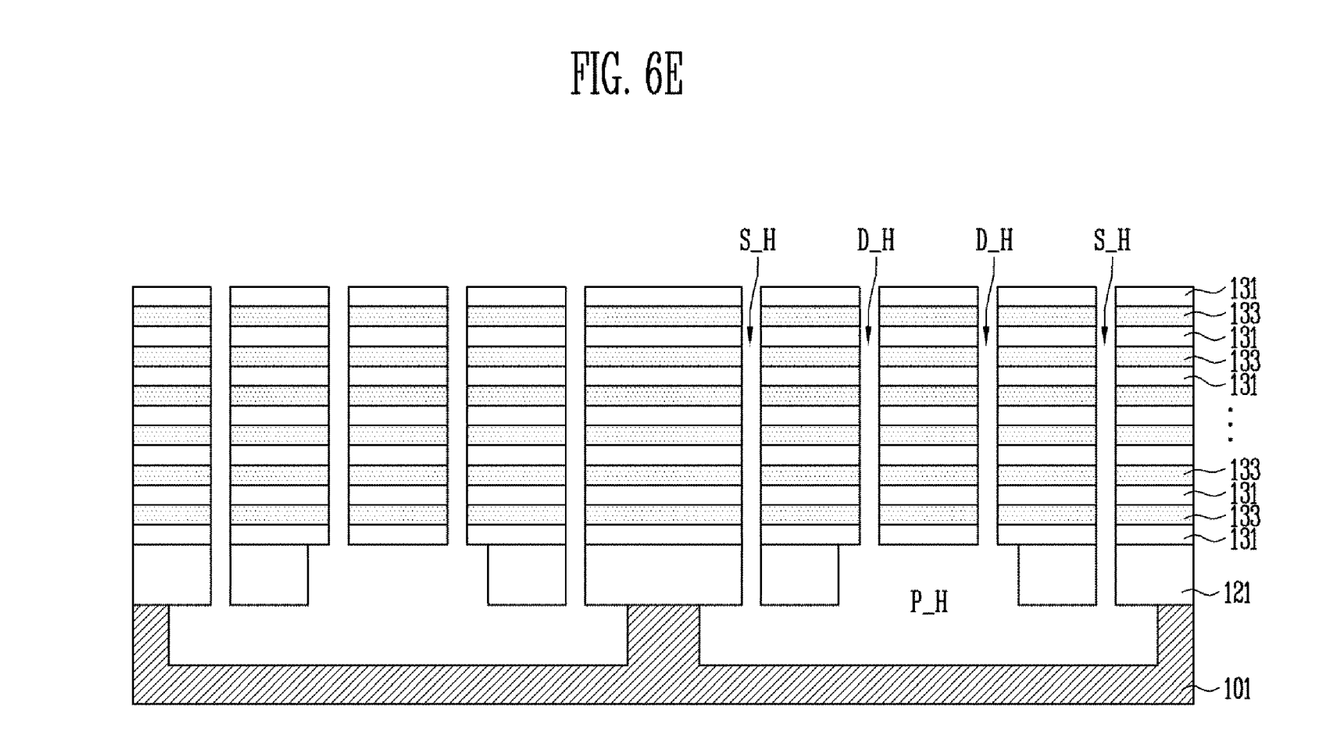

Referring to FIG. 6E, a pipe channel area P_H is opened by removing the first sacrificial layer pattern 111 and the second sacrificial layer pattern 113 opened by the first and second channel holes D_H and S_H.

Figure 6F:
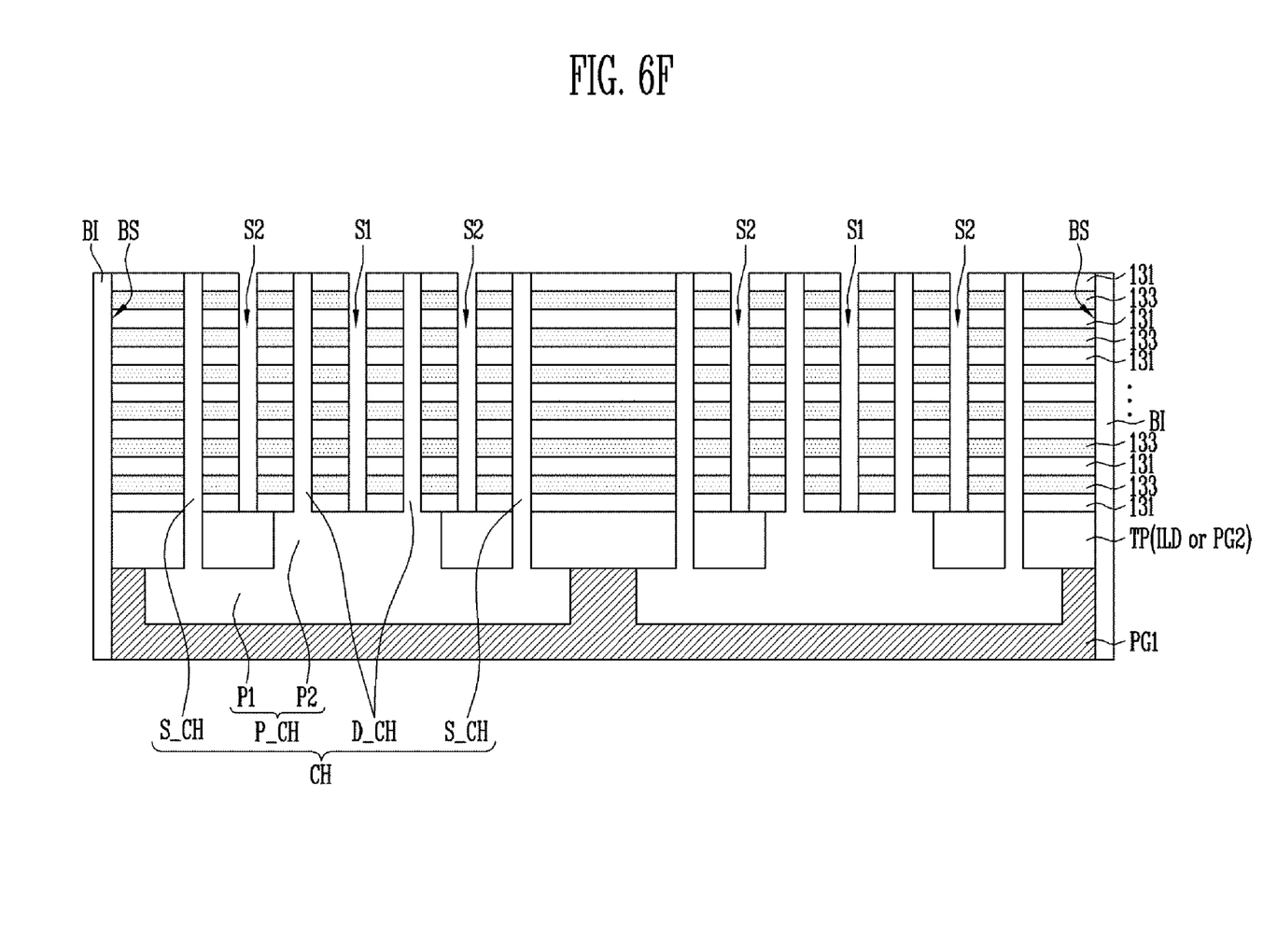

Referring to FIG. 6F, a channel layer CH may be formed in the pipe channel area P_H and the first and second channel holes D_H and S_H. The channel layer CH may include a pipe channel layer P_CH and channel pillars D_CH and S_CH protruding from the pipe channel layer P_CH. The pipe channel layer P_CH may be disposed in the pipe channel area P_H. The channel pillars D_CH and S_CH may include first channel pillars D_CH disposed in the first channel holes D_H, and second channel pillars S_CH disposed in the second channel holes S_H. The channel layer CH may be formed as the structure described in FIGS. 5A and 5B. The second channel pillars S_CH may be formed to be longer than the first channel pillars D_CH.

Before the channel layer CH is formed, at least one layer configuring the multiple layers described in FIG. 1 may be formed.

Next, the first material layers 131, the second material layers 133, the upper layer 121, and the first conductive layer 101 may be etched to form a block slit BS passing therethrough. The first material layers 131, the second material layers 133, the upper layer 121, and the first conductive layer 101 may be separated into memory block units by the block slit BS. The upper layer 121 may be separated into top patterns TP by the block slit BS. The first conductive layer 101 may be separated into first pipe gates PG1 by the block slit BS. The top patterns TP may be insulating patterns ILD or second pipe gates PG2. After the block slit BS is formed, the block slit BS may be filled with a block insulating layer BI.

Next, the first and second material layers 131 and 133 disposed between the first channel pillars D_CH. In addition, the first and second material layers 131 and 133 disposed between the first channel pillar D_CH and the second channel pillar S_CH adjacent to each other are etched. Thus, a first slit S1 and a second slit S2 are formed. The first slit S1 passes through the first and second material layers 131 and 133 disposed between the first channel pillars D_CH. Further, the second slit S2 passes through the first and second material layers 131 and 133 disposed between the first channel pillar D_CH and the second channel pillar S_CH adjacent to each other. The first material layers 131 and the second material layers 133 may be separated into drain-side stacked structures and source-side stacked structures by the first and second slits S1 and S2. The drain-side stacked structures are portions surrounding the first channel pillars D_CH. In addition, the source-side stacked structures are portions surrounding the second channel pillars S_CH.

When the first material layers 131 and the second material layers 133 are formed of a conductive material, the pipe channel layer P_CH may be etched due to the etch process for forming the first and second slits S1 and S2. The pipe channel layer P_CH according to an embodiment of the invention includes a second portion P2 protruding from a first portion P1. Accordingly, even when the pipe channel layer P_CH is etched due to the etch process for forming the first and second slits S1 and S2, only the relatively protruding second portion P2 is etched. As a result, the first slit S1 and the second slit S2 may be disposed at a higher level than the first portion P1 without fully penetrating to the first portion P1 of the pipe channel layer P_CH. Accordingly, an embodiment of the invention may reduce failures in which the pipe channel layer P_CH is broken. In addition, when the second slit S2 is disposed on the first portion P1 of the pipe channel layer P_CH with the top pattern TP therebetween, the top pattern TP may protect the first portion P1 from being etched during the etch process for forming the second slit S2.

Subsequent processes may be variously performed depending on a material for forming the first material layers 131 and the second material layers 133.

For example, when the first material layers 131 are formed of an insulating material insulating the conductive patterns, and the second material layers 133 are formed of a conductive material for forming the conductive patterns, the first and second slits S1 and S2 may be filled with an insulating material. Accordingly, a first slit insulating layer SI1 and a second slit insulating layer SI2 described in FIG. 6G may be formed.

Figure 6G:
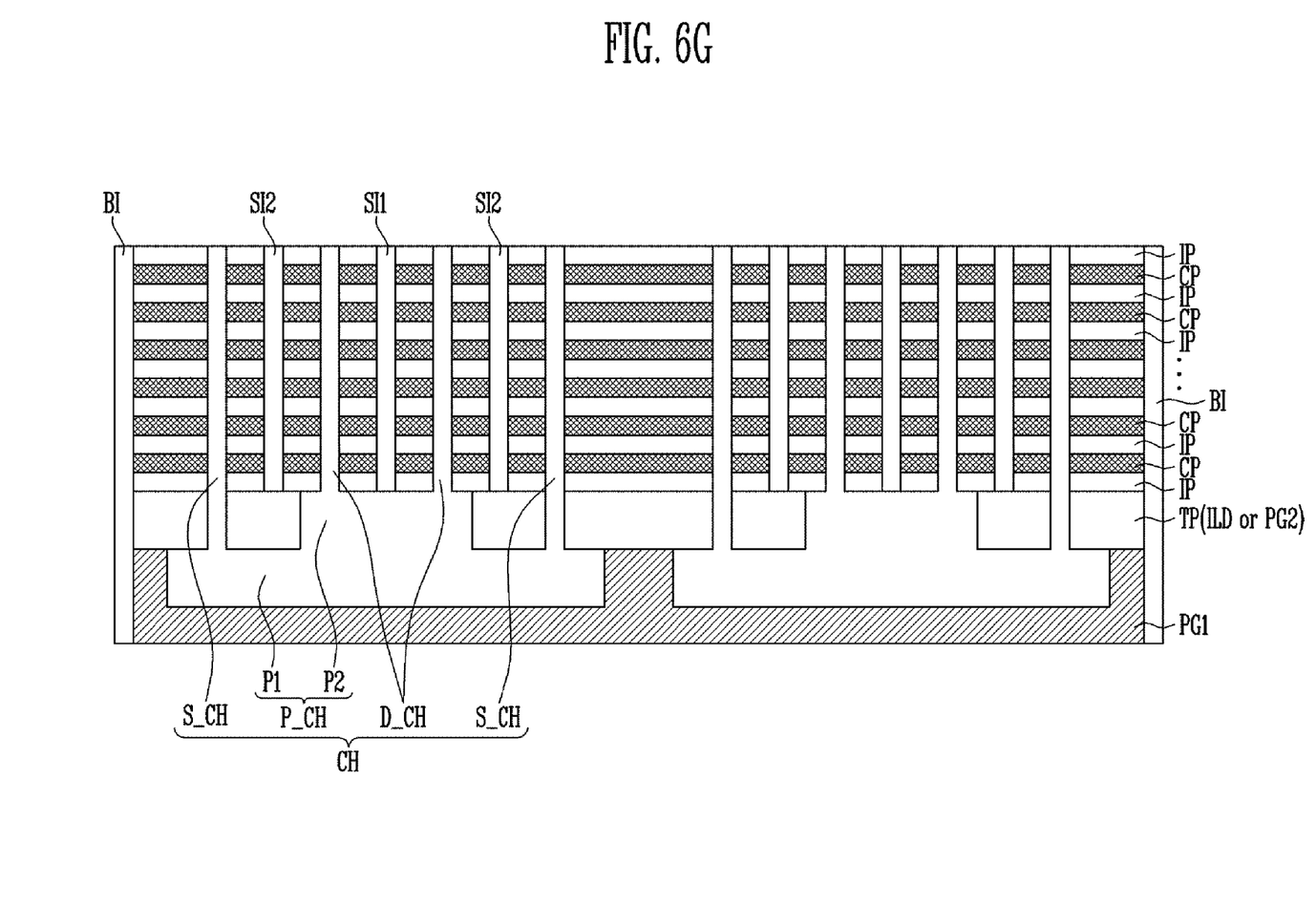

When the first material layers 131 are formed of an insulating material insulating the conductive patterns, and the second material layers 133 are formed of an insulating material for forming a sacrificial layer, the second material layers 133 exposed through the first and second slits S1 and S2 are removed to open conductive pattern areas. Next, a conductive layer is formed to fill the conductive pattern areas. Further, portions of the conductive layer in the first and second slits S1 and S2 are removed such that the conductive layers are patterned into conductive patterns CP separated by conductive pattern areas as shown in FIG. 6G. As such, the first and second slits S1 and S2 are opened. Even when the pipe channel layer P_CH is etched due to an effect of the conductive layer etch process for opening the first slit S1 and the second slit S2, only the relatively protruding second portion P2 is etched. Therefore, failures in which the pipe channel layer P_CH is broken may be reduced. In addition, the top pattern TP may protect the first portion P1 from being etched during the etch process for opening the second slit S2. After the conductive patterns CP are formed, the first slit insulating layer SI1 and the second slit insulating layer SI2 described in FIG. 6G may be formed by filling the first and second slits S1 and S2 with an insulating material.

Although not shown in FIG. 6G, when the first material layers 131 are formed of a conductive material for forming a sacrificial layer, and the second material layers 133 are formed of a conductive material for forming conductive patterns, insulating pattern areas are opened by removing the first material layers 131 exposed through the first and second slits S1 and S2. Next, an insulating layer may be formed to fill the insulating pattern areas and the first and second slits S1 and S2.

Through the various processes described, a structure in which insulating patterns IP and conductive patterns CP are alternately stacked is formed. The first and second slits S1 and S2 are filled with an insulating material. In addition, subsequent processes for forming the common source lines SL, the drain contact plugs DCT, and the bit line BL described in FIG. 3 may be formed.

According to embodiments of the invention, a phenomenon in which channel layers are broken may be reduced using a pipe channel layer including a first portion and a second portion protruding from the first portion.

Figure 7:
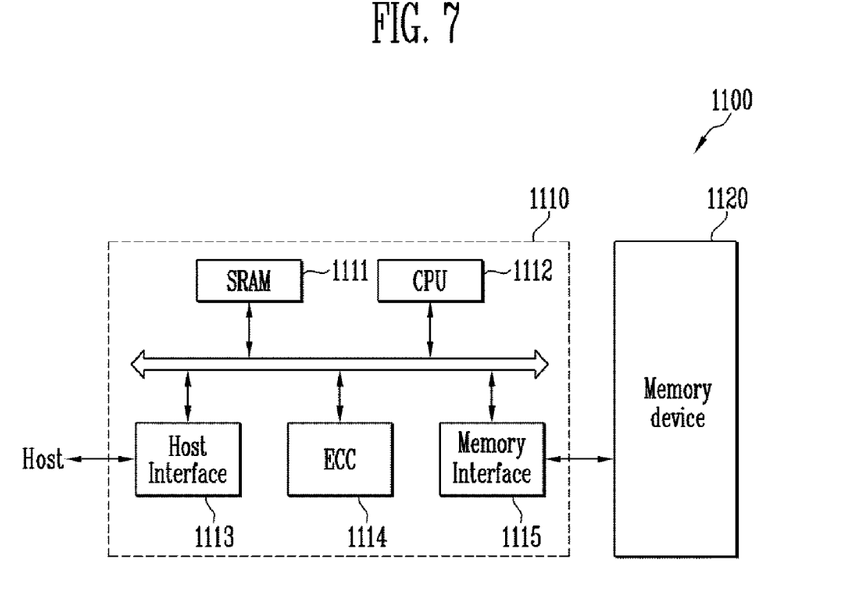
FIG. 7 is a configuration diagram showing a memory system according to an embodiment of the invention.

Referring to FIG. 7, a configuration diagram showing a memory system according to an embodiment of the invention is shown.

Referring to FIG. 7, a memory system 1100 according to an embodiment of the invention may include a memory device 1120 and a memory controller 1110.

The memory device 1120 has the structure described in FIGS. 1 to 6G. In addition, the memory device 1120 may be a multichip package configured as a plurality of flash memory chips.

The memory controller 1110 may be configured to control the memory device 1120. The memory controller 1110 may include an SRAM 1111, a CPU 1112, a host interface 1113, an ECC 1114, and a memory interface 1115. The SRAM 1111 may be used as an operation memory of the CPU 1112. The CPU 1112 may perform various operations for data exchange of the memory controller 1110. The host interface 1113 may include a protocol for data exchange of a host electrically coupled to the memory system 1100. In addition, the ECC 1114 may detect and correct errors included in data read from the memory device 1120. In addition, the memory interface 1115 may perform interfacing with the memory device 1120. Further, the memory controller 1110 may further include a ROM, etc. that stores code data for interfacing with host.

The memory system 1100 having the above-described configuration may be a memory card or a solid state disk (SSD) in which the memory device 1120 and the controller 1110 are combined. For example, when the memory system 1100 is an SSD, the memory controller 1110 may communicate with the outside (e.g., the host) through one among various interface protocols, such as USB, MMC, PCI-E, SATA, PATA, SCSI, ESDI, and IDE.

Figure 8:
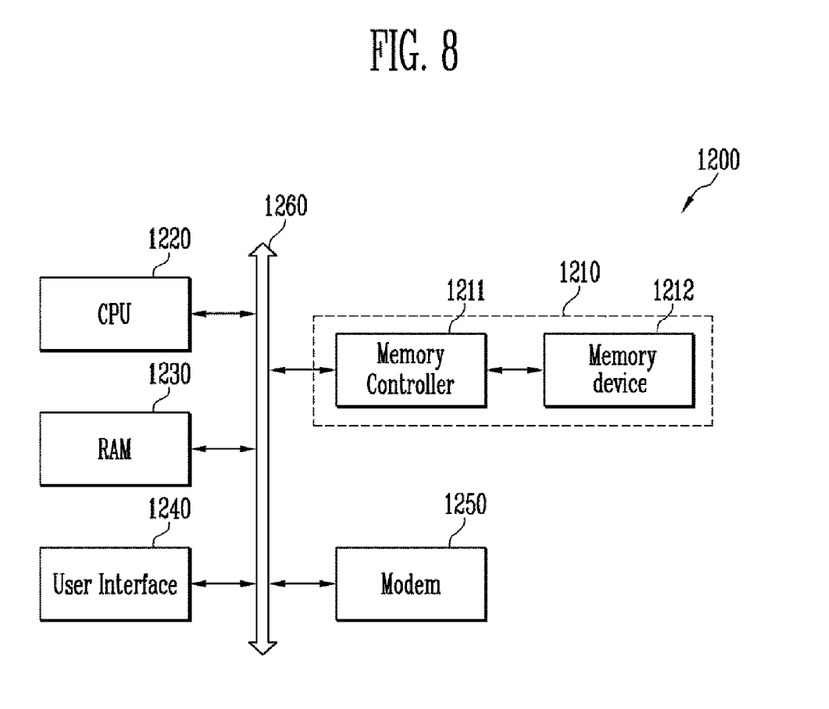
FIG. 8 is a configuration diagram showing a computing system according to an embodiment of the invention.

Referring to FIG. 8, a configuration diagram showing a computing system according to an embodiment of the invention is shown.

A computing system 1200 according to an embodiment of the invention may include a CPU 1220, a RAM 1230, a user interface 1240, a modem 1250, and a memory system 1210 which are electrically coupled to a system bus 1260. In addition, when the computing system 1200 is a mobile apparatus, a battery supplying operation energy to the computing system 1200 may be further included, and an application chipset, a camera image processor (CIS), a mobile DRAM, etc. may be further included.

The memory system 1210 may be configured as a memory device 1212 and a memory controller 1211 as described with reference to FIG. 7.

According to embodiments of the invention, a phenomenon in which channel layers are broken may be reduced using a pipe channel layer including a first portion and a second portion protruding from the first portion.

It will be apparent to those skilled in the art that various modifications can be made to the above-described embodiments of the invention without departing from the spirit or scope of the invention. Thus, it is intended that the invention cover all such modifications provided they come within the scope of the appended claims and their equivalents.

What is claimed is:

1. A method of manufacturing a semiconductor device, comprising:
   forming a lower structure including a pipe channel region filled with a first sacrificial layer pattern and a second sacrificial layer pattern, wherein the second sacrificial layer pattern is in contact with and disposed on the first sacrificial layer pattern;
   alternately stacking first material layers and second material layers on the lower structure;
   forming first channel holes and second channel holes passing through the first and second material layers, wherein the first channel holes open the second sacrificial layer pattern and the second channel holes open the first sacrificial layer pattern;

opening the pipe channel region by removing the first and second sacrificial layer patterns through the first and second channel holes; and forming a channel layer in the first and second channel holes and the pipe channel region.

2. The method of claim 1, wherein the forming of the lower structure including the pipe channel region filled with the first and second sacrificial layer patterns comprises:

forming a pipe trench by etching a first conductive layer;

forming the first sacrificial layer pattern in the pipe trench;

forming the second sacrificial layer pattern on a portion of the first sacrificial layer pattern; and forming an upper layer that surrounds the second sacrificial layer pattern on the first conductive layer and covers the first sacrificial layer pattern.

3. The method of claim 1, wherein the second sacrificial layer pattern opens both sides of the first sacrificial layer pattern and is disposed on a center area of the first sacrificial layer pattern.

4. The method of claim 1, further comprising:

forming a first slit passing through the first material layers and the second material layers between the first channel holes, and a second slit passing through the first material layers and the second material layers between the first channel hole and the second channel hole after forming the channel layer.

\* \* \* \* \*